United States Patent [19]

Guajardo

[11] Patent Number: 4,916,572
[45] Date of Patent: Apr. 10, 1990

[54] CIRCUITRY FOR PROTECTING AGAINST LOAD VOLTAGE TRANSIENTS IN SOLID STATE RELAY CIRCUITS

[75] Inventor: Ciro Guajardo, Harbor City, Calif.

[73] Assignee: Teledyne Industries, Inc., Los Angeles, Calif.

[21] Appl. No.: 316,406

[22] Filed: Feb. 27, 1989

[51] Int. Cl.⁴ .............................................. H02H 3/20
[52] U.S. Cl. ........................................ 361/91; 361/56
[58] Field of Search ................ 361/56, 57, 86, 87, 361/91, 93, 98, 100, 101; 220/207 P, 298

[56] References Cited

U.S. PATENT DOCUMENTS

| | | | |
|---|---|---|---|
| 4,423,431 | 12/1983 | Sasaki | 357/41 |
| 4,424,544 | 1/1984 | Chang | 361/56 |
| 4,528,608 | 7/1985 | Andersson | 361/18 |
| 4,541,002 | 9/1985 | Shimada | 357/51 |
| 4,546,401 | 10/1985 | Svedberg | 361/91 |
| 4,551,779 | 11/1985 | Murakami | 361/86 |
| 4,566,052 | 1/1986 | Kammiller | 361/18 |
| 4,573,099 | 2/1986 | Ganesan | 361/56 |
| 4,581,540 | 4/1986 | Guajardo | 361/93 X |
| 4,617,482 | 10/1986 | Matsuda | 307/579 |
| 4,644,250 | 2/1987 | Hartgring | 323/225 |
| 4,661,879 | 4/1987 | Sato | 361/58 |
| 4,686,383 | 8/1987 | Croft | 307/200 |
| 4,691,129 | 9/1987 | Einzinger | 307/581 |
| 4,716,511 | 12/1987 | Masaki | 363/49 |

Primary Examiner—Derek S. Jennings
Attorney, Agent, or Firm—Stephen L. King

[57] ABSTRACT

A solid state relay circuit including a power semiconductor for the switching device, the power semiconductor having gate, source, and drain terminals, the source and drain terminals being adapted to be connected across a load circuit, switching circuitry providing a normally non-conducting path between the gate and source terminals, and circuitry for switching the switching device to a conducting condition in response to the appearance of voltage spikes in the output circuit having a value sufficient to cause the power semiconductor to conduct before the power semiconductor can be caused to conduct.

9 Claims, 2 Drawing Sheets

CIRCUITRY FOR PROTECTING AGAINST LOAD VOLTAGE TRANSIENTS IN SOLID STATE RELAY CIRCUITS

BACKGROUND OF THE INVENTION

1. Field of the Invention

This invention relates to solid state relay circuits and, more particularly, to solid state relay circuits with circuitry to protect the solid state relay from rapid voltage changes in the load circuitry.

2. History of the Prior Art

A great variety of solid state relay circuits have been developed which use a power semiconductor as the output circuit switching device. A major disadvantage of such circuits has been their sensitivity to voltage transients in the load circuitry. In some circuits these voltage transients may be as great as one hundred to two hundred volts per microseconds. Such voltage spikes may be transferred by the inter-terminal capacitance to the gate of the switching device and cause the momentary turn on of the switching device at an inopportune time.

It is therefore an object of this invention to provide improved solid state relay circuits.

It is another object of this invention to provide solid state relay circuits incorporating circuitry for reducing the response of the output switching device to voltage transients in the load circuit.

SUMMARY OF THE INVENTION

The foregoing and other objects of the invention are accomplished by a solid state relay circuit which utilizes a metal oxide power semiconductor field effect transistor (MOSFET) having drain and source terminals which are connected to circuit output terminals. The output terminals are connected in series across a load and a power source. A switching circuit is provided which senses the voltage transient in the load and, if sufficiently great, shorts the gate terminal of the MOSFET before it has time to respond to the voltages changes and turn on.

Two particular forms of circuitry are disclosed, one of which protects against voltage transients in the load circuit of an arrangement using a transistor circuit arrangement and the other of which utilizes a MOSFET circuit arrangement.

Other objects, features, and advantages of the invention will become apparent to those skilled in the art upon reading the following detailed description together with the several figures of the drawings in which like designations have been used for identical elements throughout the several views.

DESCRIPTION OF THE PREFERRED EMBODIMENT

Figure 1:
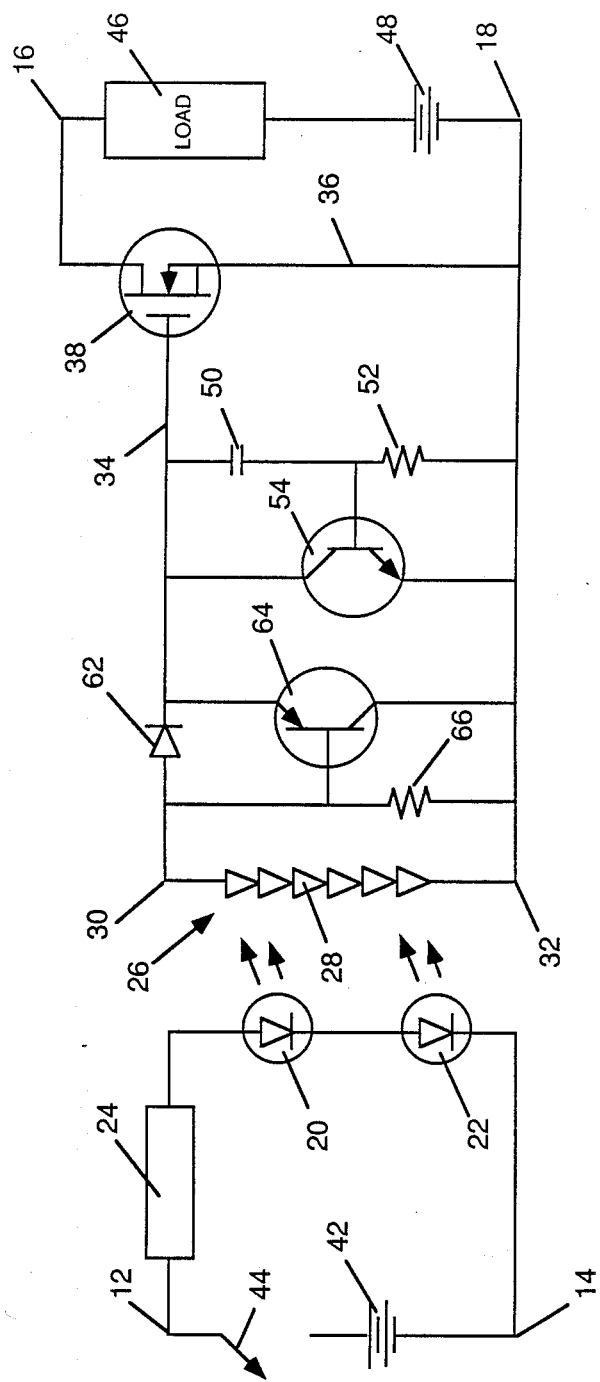
FIG. 1 is a schematic diagram of a first embodiment of the invention in which a transistor biased by a timing circuit is used to short circuit the gate to source terminals of an output switching MOSFET when voltage transients appear in the load.

Referring to FIG. 1 there is shown a control circuit 10 constructed in accordance with the invention. The circuit 10 includes a pair of input terminals 12 and 14 and a pair of output terminals 16 and 18.

Connected between the terminals 12 and 14 is a series circuit comprising first and second light emitting diodes (LEDs) 20 and 22 and a current limiting element such as a resistor 24.

In the preferred embodiment of the invention, the LEDs 20 and 22 provide infrared light output signals when activated. The LEDs 20 and 22 are positioned adjacent to and optically coupled to a photodiode array 26 having positive and negative output terminals 30 and 32, respectively. The array 26 includes a plurality of photodiodes 28 connected in series to form a photovoltaic voltage source. It is well known to those skilled in the art that a photodiode will produce a voltage and a current (approximately one half a volt at about ten microamperes for a small area silicon diode) in response to light impinging on the surface thereof. The amount of current available from a particular photodiode is proportional to the amount of light impinging on its surface.

By connecting in series a plurality of photodiodes 28, the voltages generated by each are added to produce a desired voltage level at the output terminals 30 and 32 of the array 236. In the preferred embodiment, sixteen photodiodes 28 are connected in series to produce an output voltage of about eight volts at a current level of about ten microamperes in response to light from the LEDs 20 and 22; this voltage is sufficient to operate the output switching device of the circuit. The number of LEDs used to illuminate the array 26 is a matter of design choice. The array 26 is typically fabricated as a integrated circuit device using manufacturing techniques such as dielectric isolation which are well known to those skilled in the art.

The positive terminal 30 of the array 26 is connected by a diode 62 to the gate terminal 34 of an N-channel, enhancement mode MOSFET 38. The negative terminal 32 of the array 26 is connected to the source terminal 36 of the MOSFET 38, and the drain and source terminals of the MOSFET 38 are, in turn, connected respectively to the circuit output terminals 16 and 18.

Power MOSFETs are characterized by their ability to switch several amperes of current between their output (drain and source terminals) from a power source of up to several hundred volts. These devices exhibit low output resistance in the on, or conducting, state (typically one-one hundredth of an ohm to ten ohms) and exhibit high output resistance in the off, or non-conducting state (typically one to one hundred megohms). A typical MOSFET device for use in the invention is type number IRF520, supplied by International Rectifier, El Segundo, Calif., or RSP 12N10 manufactured by RCA.

The MOSFET 38 is biased into full conduction by the application of a first level of voltage (typically six to eight volts) between the gate and source terminals 34 and 36. The first level of voltage is referred to as the turn-on voltage of the MOSFET 38. When the gate to source voltage is below a second level of voltage (typically 1 to 3 volts) the MOSFET 38 is biased into a non-conducting state. This second level of voltage is referred to as the turn-off voltage of the MOSFET 38.

The operation of the circuit 10 as discussed thus far is as follows. An input signal is applied to the input terminals 12 and 14 by, for example, connecting a voltage source 42 across the terminals 12 and 14 using a switch 44 as shown in FIG. 1. In response to the input signal, the LEDs 20 and 22 generate light. This light is optically coupled to the diode array 26 which causes it to produce a voltage across the gate and source terminals 34 and 36 of the MOSFET 38. The MOSFET 38 is biased into full conduction providing a low impedance current path across the output terminals 16 and 18. When the MOSFET 38 is conducting, power is applied to a load 46 from a power source 48. The load 46 and the source 48 are connected in series across the terminals 16 and 18 as shown in FIG. 1. When the switch 44 is opened, the LEDs 20 and 22 no longer generate light. Consequently, the voltage provided by the array 26 drops to zero, and the MOSFET 38 turns off.

Connected between the terminal 30 of the array 26 and the gate terminal 34 of the MOSFET 38 is the diode 62 oriented to permit current flow toward the gate terminal 34. A PNP bipolar transistor 64 is provided having its emitter terminal connected to the gate terminal 34, its collector terminal connected to the source terminal 36 of the MOSFET 38, and its base terminal connected to the terminal 30 of the array 26. A resistor 66 is connected across the terminals 30 and 32 of the array 26. The PNP transistor 64 is normally non-conducting during the operation of the MOSFET 38. However, it is biased into conduction between its emitter and collector terminals when the array 26 ceases generating voltage. The transistor 64 thus acts to speed up the turn-off time of the MOSFET 38 by providing a discharge path for the inherent capacitance associated with the gate-source elements of the MOSFET 38. The diode 62 couples the bias voltage from the array 26 to the gate 34 of the MOSFET 38. Accordingly, the MOSFET 38 responds to closures of the switch 44 by switching into a conducting state. When the switch 44 is opened, the MOSFET 38 switches to a nonconducting state in an extremely short interval of time due in part to the conduction of the transistor 64.

The best method for providing immunity to turn on of the output MOSFET 38 due to a rapid voltage transient in the output circuit is to short the gate 34 of the MOSFET 38. To this end the circuit 10 of FIG. 1 includes a capacitor 50 and a resistor 52 connected in series between the gate and source terminals of the MOSFET 38. In a preferred embodiment of the invention, the capacitor 50 has a value of approximately 470 picofarads and the resistor 52 a value of between five and ten Kohms. Connected between the capacitor 50 and the resistor 52 is the base terminal of an NPN transistor 54. The transistor 54 which may be a 2N2222 type has its emitter terminal connected to the terminal 18 and its collector connected to the gate of the MOSFET 38.

When a voltage transient appears in the output circuit between terminals 16 and 18 sufficient to turn on the MOSFET 38, this voltage transient is coupled by the drain-to-gate capacitance of the MOSFET 38 to the capacitor 50. The voltage transient is sufficient to turn on the transistor 54 which is chosen to have a turn-on time shorter than the turn-on time of the MOSFET 38. Consequently, the transistor 54 shorts the gate to source terminals of the MOSFET 38 so that conduction does not occur.

Figure 2:
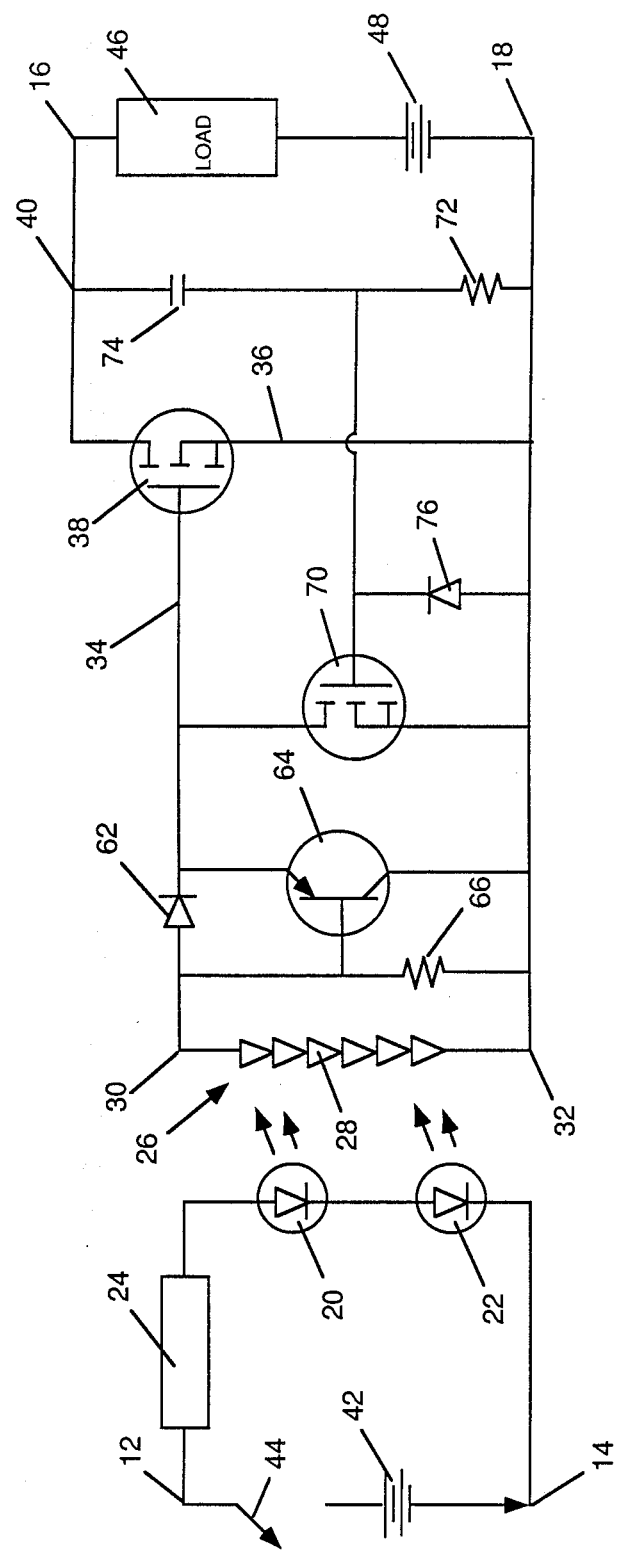
FIG. 2 is a schematic diagram of a second embodiment of the invention in which a MOSFET biased by a timing circuit is used to short circuit the gate to source terminals of an output switching MOSFET when voltage transients appear in the load.

In the arrangement shown in FIG. 2, a second MOSFET 70 is placed between the gate 34 of the MOSFET 38 and the terminal 32. The gate terminal of the MOSFET 70 is connected between a resistor 72 and a capacitor 74 connected in series across the load terminals 16 and 18. The RC time constant of the resistor 72 and the capacitor 74 is chosen to be approximately 0.3 microseconds. Under normal load conditions, the MOSFET 70 does not conduct and, therefore, does not affect the circuit. However, when a fast voltage transient is experienced in the output circuit, the capacitor 74 causes the turn on of the gate of MOSFET 70 thereby shorting the gate of MOSFET 38 to the source for a sufficient period that MOSFET 38 is prevented from turning on.

A zener diode 76 is connected between the source and the gate terminals of the MOSFET 70 in FIG. 2 to limit the voltages across the resistor 22 which might destroy the MOSFET 70.

By means of the invention herein disclosed, the sensitivity to voltage transients in the load circuitry of solid state relay circuits which use a power semiconductor for switching device has been eliminated. The circuits disclosed herein may be used in the presence of large voltage transients without the voltage spikes being transferred by the interterminal capacitance of the switching device to cause the momentary turn on of the switching device with possibly catastrophic results to the associated circuitry.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A solid state relay circuit comprising a power semiconductor for the switching device, the power semiconductor having gate, source, and drain terminals, the source and drain terminals being adapted to be connected across a load circuit, switching means providing a normally non-conducting path between the gate and source terminals, and means for switching the switching device to a conducting condition in response to the appearance of voltage spikes in the output circuit having a vale sufficient to cause the power semiconductor to conduct before the power semiconductor can be caused to conduct.

2. A solid state relay circuit as claimed in claim 1 in which the switching means comprises a transistor.

3. A solid state relay circuit as claimed in claim 1 in which the switching means comprises a MOSFET.

4. A solid state relay circuit as claimed in claim 3 in which the MOSFET has drain and source terminals connected between the gate and source terminals of the power semiconductor, and a gate terminal connected to receive voltage spikes transferred from the load circuitry.

5. A solid state relay circuit comprising a power semiconductor for the switching device, the power semiconductor having gate, source, and drain terminals, the source and drain terminals being adapted to be connected across a load circuit, switching means comprising a transistor providing a normally nonconducting path between the gate and source terminals, and means for switching the switching device to a conducting condition in response to the appearance of voltage spikes in the output circuit having a value sufficient to cause the power semiconductor to conduct before the power semiconductor can be caused to conduct, the transistor having emitter and collector terminals connected between the gate and source terminals of the power semiconductor, and a base terminal connected to receive voltage spikes transferred by the internal capacitance of the power semiconductor.

6. A solid state relay circuit as claimed in claim 5 in which the means for switching the switching device to a conducting condition comprises a capacitor connected between the gate and source terminals of the power semiconductor and to the base terminal of the transistor.

7. A solid state relay circuit as claimed in claim 6 in which the means for switching the switching device to a conducting condition further comprises a resistor connected in series with the capacitor between the gate and source terminals of the power semiconductor.

8. A solid state relay circuit comprising a power semiconductor for the switching device, the power semiconductor having gate, source, and drain terminals, the source and drain terminals being adapted to be connected across a load circuit; switching means comprising a MOSFET providing a normally nonconducting path between the gate and source terminals, the MOSFET having drain and source terminals connected between the gate and source terminals of the power semiconductor, and a gate terminal connected to receive voltage spikes transferred from the load circuitry; means for switching the switching device to a conducting condition in response to the appearance of voltage spikes in the output circuit having a value sufficient to cause the power semiconductor to conduct before the power semiconductor can be caused to conduct, the means for switching the switching device to a conducting condition comprising a capacitor connected between the drain and source terminals of the power semiconductor and to the gate terminal of the MOSFET.

9. A solid state relay circuit as claimed in claim 8 in which the means for switching the switching device to a conducting condition further comprises a resistor connected in series with the capacitor between the drain and source terminals of the power semiconductor.

* * * * *